United States Patent [19]
Hsieh

[11] Patent Number: 5,552,339
[45] Date of Patent: Sep. 3, 1996

[54] FURNACE AMORPHOUS-SI CAP LAYER TO PREVENT TUNGSTEN VOLCANO EFFECT

[75] Inventor: Shih-Huang Hsieh, Kaohsiung, Taiwan

[73] Assignee: Taiwan Semiconductor Manufacturing Company, Hsinchu, Taiwan

[21] Appl. No.: 297,501

[22] Filed: Aug. 29, 1994

[51] Int. Cl.⁶ .................................................. H01L 21/44
[52] U.S. Cl. .................................................. 437/190; 437/192
[58] Field of Search .................................. 437/190, 192, 437/246, 247

[56] References Cited

U.S. PATENT DOCUMENTS

| | | | |
|---|---|---|---|
| 5,049,975 | 9/1991 | Ajika et al. | 437/190 |
| 5,084,413 | 1/1992 | Fujita et al. | 437/189 |
| 5,134,092 | 7/1992 | Matsumoto et al. | 437/192 |
| 5,173,450 | 12/1992 | Wei | 437/200 |
| 5,175,126 | 12/1992 | Ho et al. | 437/190 |
| 5,183,782 | 2/1993 | Onishi et al. | 437/192 |
| 5,332,691 | 7/1994 | Kinoshita et al. . | |

FOREIGN PATENT DOCUMENTS 2251139  10/1990  Japan .

*Primary Examiner*—George Fourson
*Assistant Examiner*—C. Everhart
*Attorney, Agent, or Firm*—George O. Saile; Rosemary L. S. Pike

[57] ABSTRACT

A method of metallization using a tungsten plug is described. Semiconductor device structures are formed in and on a semiconductor substrate. An insulating layer covers the semiconductor structures and a contact hole has been opened through the insulating layer to the semiconductor substrate. A glue layer is deposited conformally over the surface of the insulating layer and within the contact opening. The glue layer is annealed to stuff the grain boundaries in the glue layer. A layer of amorphous-silicon is deposited overlying the glue layer to prevent tungsten hexafluoride penetration through and reaction with the glue layer during subsequent tungsten deposition. A tungsten plug is formed within the contact opening wherein the amorphous-silicon and the annealed glue layer prevent peeling of the glue layer and of the tungsten in the fabrication of an integrated circuit.

17 Claims, 3 Drawing Sheets

FURNACE AMORPHOUS-SI CAP LAYER TO PREVENT TUNGSTEN VOLCANO EFFECT

BACKGROUND OF THE INVENTION (1) Field of the Invention

The invention relates to a method of metallization in the fabrication of integrated circuits, and more particularly, to a method of tungsten metallization preventing peeling of the tungsten or underlying glue layer called the volcano effect in the manufacture of integrated circuits.

(2) Description of the Prior Art

Tungsten-plug metallization is well-known in the art. A conventional tungsten plug process of the prior art is illustrated in FIGS. 1 and 2. Referring now to FIG. 1, there is shown semiconductor substrate 10. A contact hole 22 has been opened through interlevel dielectric layer 20 to source/drain region 14. A glue layer composed of titanium layer 24 and titanium nitride layer 26 has been deposited over the surface of the substrate and within the contact hole. Referring now to FIG. 2, a layer of tungsten 28 is deposited which will form a plug within the contact hole. 30 illustrates the volcano effect. The tungsten or the titanium nitride layer will peel away from the substrate. When tungsten is blanket deposited, the tungsten hexafluoride ($WF_6$) precursor penetrates the titanium nitride film and reacts with the titanium according to the following reaction:

$$2Ti + WF_6 \rightarrow W + 2TiF_3$$

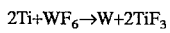

The $TiF_3$ is a nonadherent layer and will cause the tungsten or the titanium nitride to peel.

U.S. Pat. No. 5,175,126 to Ho et al teaches "stuffing" the titanium nitride grain boundaries with oxygen or nitrogen reaction products using an atmospheric annealing process in order to improve the integrity of the titanium nitride layer. U.S. Pat. No. 5,173,450 to C. C. Wei uses amorphous silicon between two titanium layers in which the amorphous silicon acts as the origin of silicon used to form $TiSi_2$ instead of the silicon's coming from the source and drain regions.

SUMMARY OF THE INVENTION

A principal object of the present invention is to provide an effective and very manufacturable method of tungsten plug metallization which prevents peeling of the tungsten layer and of the glue layer in the fabrication of an integrated circuit.

In accordance with the objects of this invention a new method of metallization using a tungsten plug is achieved. Semiconductor device structures are formed in and on a semiconductor substrate. An insulating layer covers the semiconductor structures and a contact hole has been opened through the insulating layer to the semiconductor substrate. A glue layer is deposited conformally over the surface of the insulating layer and within the contact opening. The glue layer is annealed to stuff the grain boundaries in the glue layer. A layer of amorphous-silicon is deposited overlying the glue layer to prevent tungsten hexafluoride penetration through and reaction with the glue layer during subsequent tungsten deposition. A tungsten plug is formed within the contact opening wherein the amorphous-silicon and the annealed glue layer prevent peeling of the glue layer and of the tungsten in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
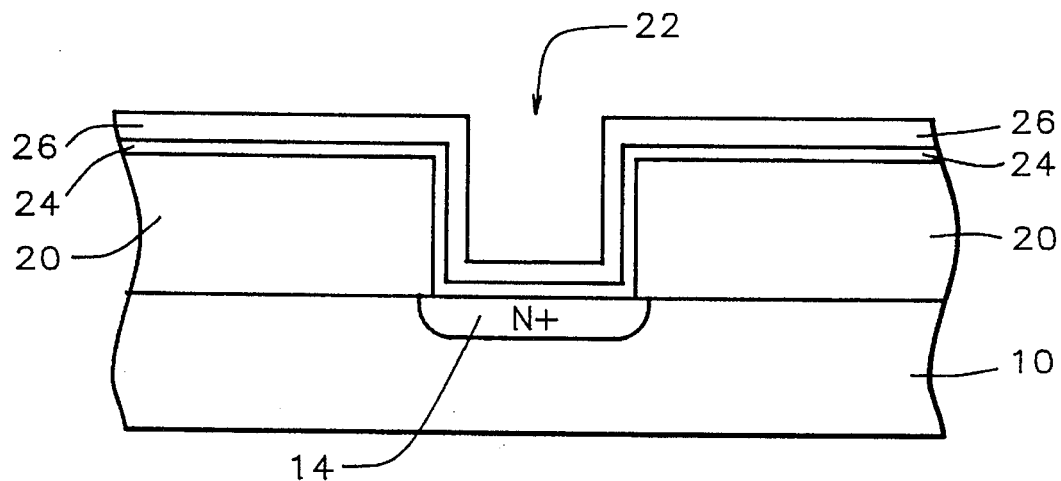
FIGS. 1 and 2 schematically illustrate in cross-sectional representation a conventional tungsten plug process of the prior art.
Figure 2:
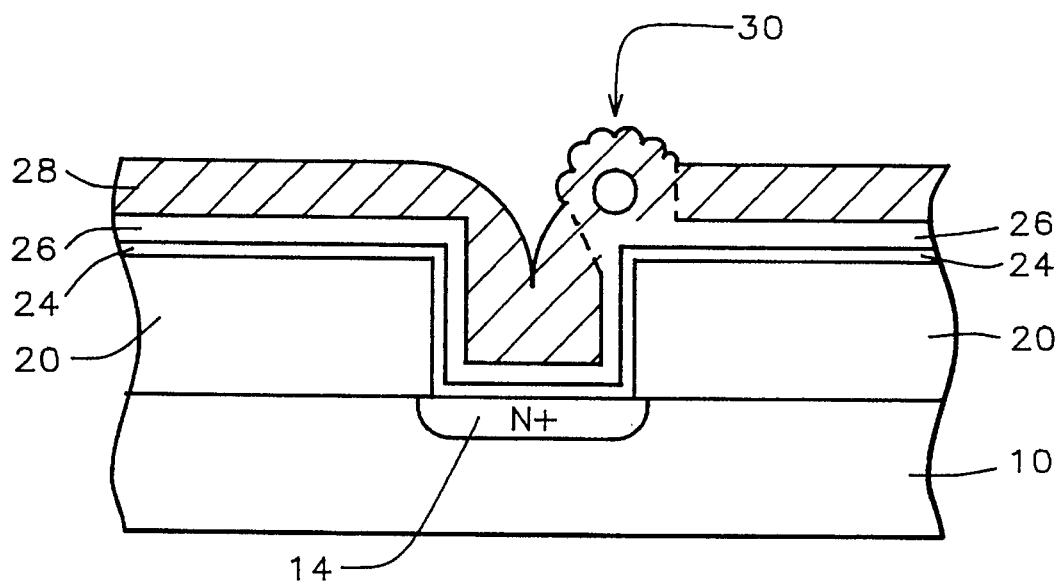
Figure 3:
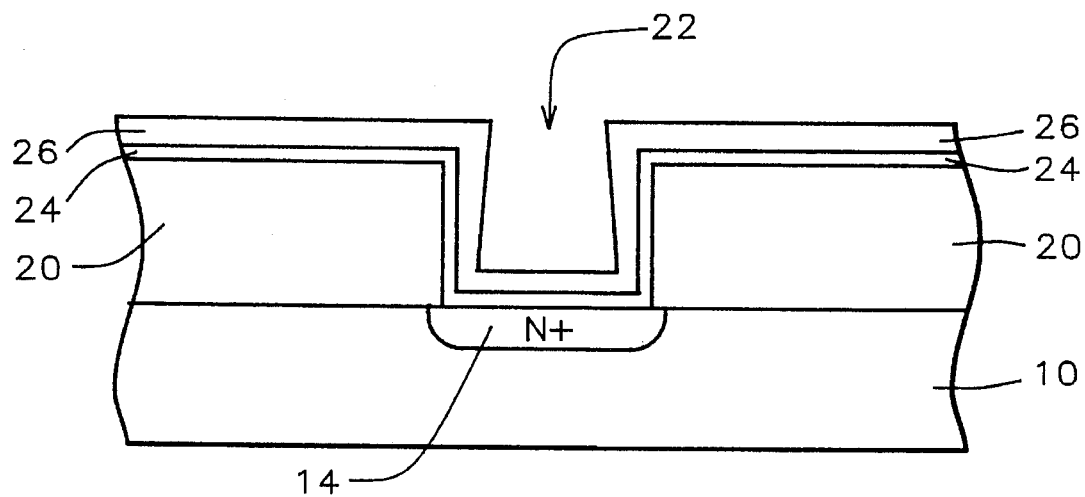
FIGS. 3 through 6 schematically illustrate in cross-sectional representation a preferred embodiment of the present invention.

Referring now more particularly to FIG. 3, there is illustrated a portion of a partially completed integrated circuit. There is shown a semiconductor substrate 10, preferably composed of monocrystalline silicon. Source/drain regions 14 are formed as is understood in the art either before or after formation of gate electrodes (not shown).

An interlevel dielectric layer 20, composed of borophosphosilicate glass (BPSG), borosilicate glass (BSG), or phosphosilicate glass (PSG) is deposited over the surface of the semiconductor device structures (for example, by a boron, phosphorus tetraethoxysilane (TEOS) method) to a thickness of between about 3000 to 20,000 Angstroms. A contact hole 22 is opened through the insulating layer to the source/drain region 14 within the semiconductor substrate. A glue layer is deposited conformally over the surface of the insulating layer 20 and within the contact hole 22. The glue layer preferably is composed of titanium 24 and titanium nitride 26. This glue layer 24/26 is deposited by chemical vapor deposition or physical vapor deposition to a thickness of between about 200 to 600 Angstroms for the titanium layer 24 and between about 600 to 2000 Angstroms for the titanium nitride layer 26.

A furnace amorphous-silicon layer is deposited as a cap layer before tungsten deposition to prevent the $WF_6$ precursor from penetrating the titanium nitride layer and reacting with the underlying titanium layer and to prevent the titanium nitride or the tungsten layer from peeling. Moreover, the titanium nitride layer can be annealed in a nitrogen ambient before the amorphous-silicon deposition to further prevent penetration of the layer by the $WF_6$.

The annealing of the titanium nitride layer stuffs the titanium nitride grain boundaries and prevents the $WF_6$ from penetrating the titanium nitride layer. The amorphous-silicon cap provides another protection against the tungsten volcano effect especially at the wafer edge. The titanium nitride property is weakest at the wafer edge because of the limited sputter design; that is, poor step coverage and poor film quality.

First, the titanium nitride layer is annealed in a furnace in a nitrogen ambient at a temperature of between about 400° to 480° C. for between about 10 to 20 minutes. This results in stuffing of the grain boundaries. That is, the nitrogen gas is absorbed into the titanium nitride grains at the grain boundaries, filling them so that the $WF_6$ will be unable to penetrate the layer.

Figure 4:
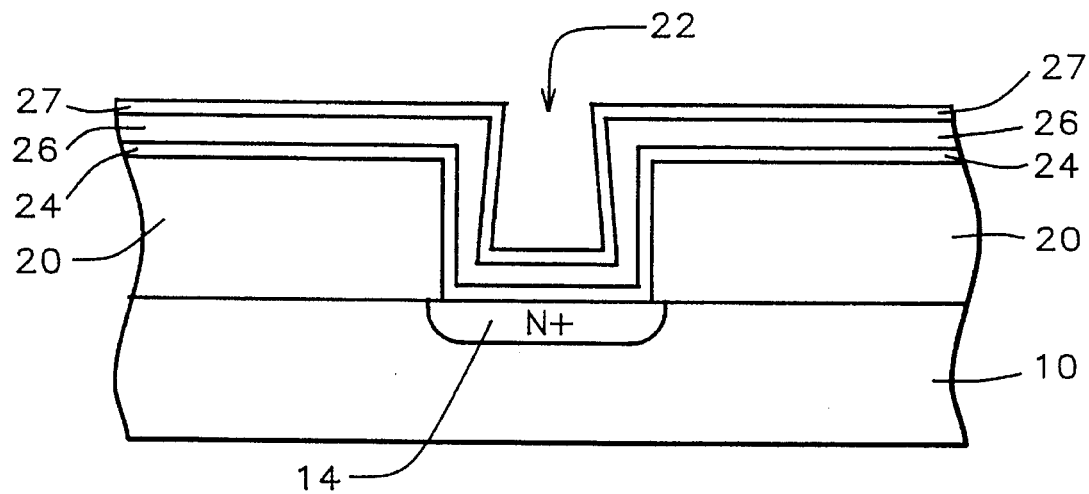

Without breaking vacuum in the furnace, the second step of depositing the amorphous-silicon is performed. Amorphous silicon is deposited at a temperature of between about 450° to 480° C. at a pressure of less than about 0.2 Torr to a thickness of between about 50 to 100 Angstroms. Dichlorosilane is used. The amorphous-silicon cap must be thick enough to prevent penetration of the underlying glue layer, but it must be thin enough to not cause any resistance contact problems. The amorphous-silicon cap is illustrated by 27 in FIG. 4.

Alternatively, the titanium nitride layer can be annealed by a rapid thermal anneal in a nitrogen ambient at a temperature of between about 580° to 650° C. for between about 20 to 40 seconds. If this annealing method is used, then the amorphous-silicon should be deposited in a separate low pressure chemical vapor deposition (LPCVD) furnace. That is, the vacuum is broken after annealing, then the amorphous-silicon is deposited as described above.

Figure 5:
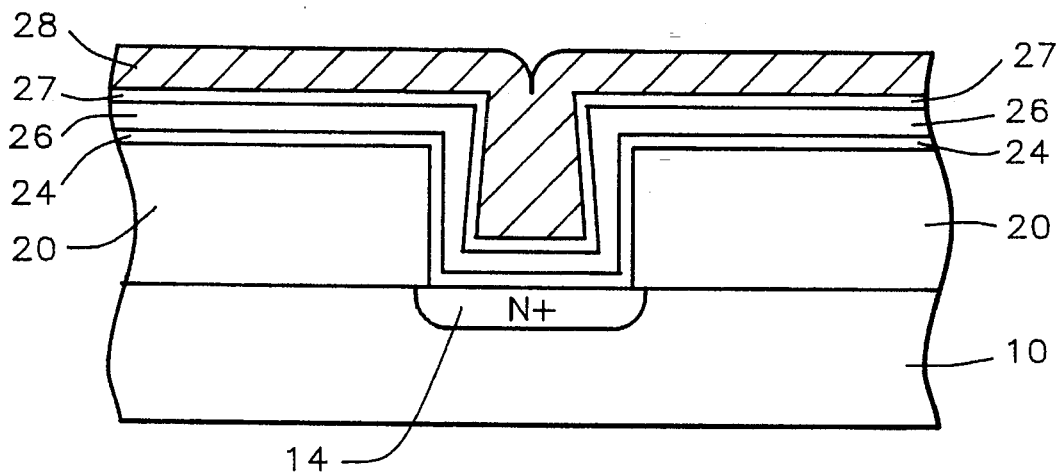

Referring now to FIG. 5, tungsten 28 is blanket deposited over the surface of the substrate using $WF_6$ as a precursor in a chemical vapor deposition chamber. Deposition temperature is about 475° C. The wafer temperature should be between about 435° to 450° C.

Figure 6:
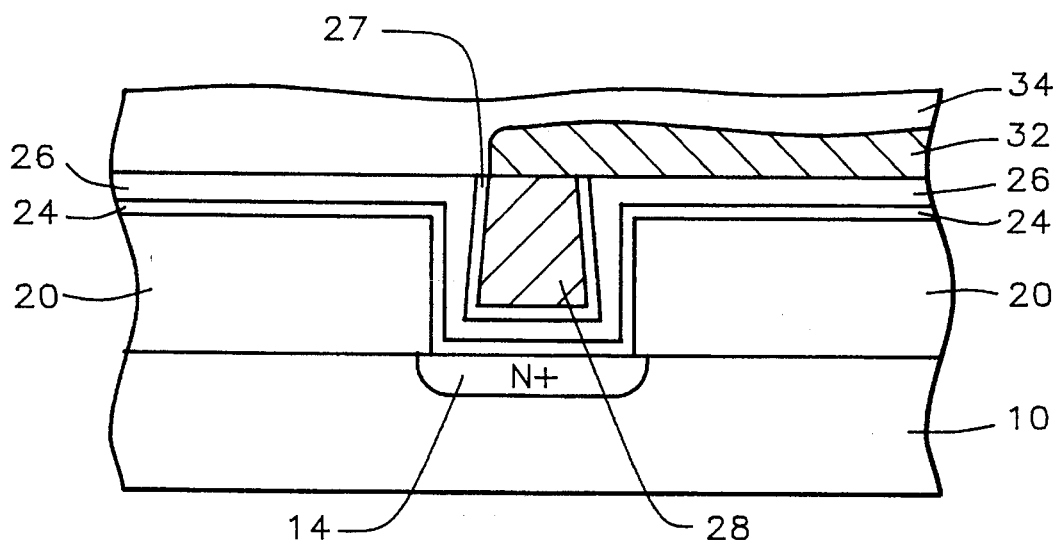

Referring to FIG. 6, the tungsten is etched back to form the tungsten plug 28 within the contact hole. The exposed amorphous silicon 27 is also removed. The second metallization 32, such as an aluminum alloy, is deposited and patterned. A passivation layer 34 completes fabrication of the integrated circuit. Of course, other processes may be performed such as an intermetal dielectric deposition and further metallization, as is well known in the art.

While the invention has been particularly shown and described with reference to the preferred embodiments thereof, it will be understood by those skilled in the art that various changes in form and details may be made without departing from the spirit and scope of the invention.

What is claimed is:

1. The method of forming tungsten plug metallization without peeling of the tungsten or the glue layer in the fabrication of integrated circuits comprising:

providing semiconductor device structures in and on a semiconductor substrate;

providing an insulating layer covering said semiconductor device structures wherein a contact hole has been opened through said insulating layer to said semiconductor substrate;

depositing a glue layer conformally over the surface of said insulating layer and within said contact opening;

annealing said glue layer to prevent peeling of said glue layer;

depositing a layer of amorphous silicon to a thickness of between about 50 to 100 Angstroms overlying said glue layer to prevent peeling of said glue layer and to prevent peeling of said tungsten to be deposited subsequently; and forming a tungsten plug within said contact opening in the fabrication of said integrated circuit.

2. The method of claim 1 wherein said glue layer is composed of a first layer of titanium having a thickness of between about 200 to 600 Angstroms and a second layer of titanium nitride having a thickness of between about 600 to 2000 Angstroms.

3. The method of claim 1 wherein said glue layer is annealed in a nitrogen ambient at a temperature of between about 400° to 480° C. for between about 10 to 20 minutes and wherein nitrogen atoms from said nitrogen ambient fill the grain boundaries of said glue layer preventing penetration of said glue layer by subsequent metallization and wherein said preventing penetration prevents said peeling of said glue layer.

4. The method of claim 3 wherein said annealing of said glue layer and said amorphous silicon layer deposition are performed within the same furnace without breaking vacuum between said annealing and said deposition.

5. The method of claim 1 wherein said glue layer is annealed in a rapid thermal anneal process in a nitrogen ambient at a temperature of between about 580° to 650° C. for between about 20 to 40 seconds and wherein nitrogen atoms from said nitrogen ambient fill the grain boundaries of said glue layer preventing penetration of said glue layer by subsequent metallization and wherein said preventing penetration prevents said peeling of said glue layer.

6. The method of claim 1 wherein said amorphous silicon layer is deposited at a temperature of between about 450° to 480° C. at a pressure of less than about 0.2 Torr and wherein said amorphous silicon layer will prevent penetration of said underlying glue layer by subsequent metallization and wherein said preventing penetration prevents said peeling of said glue layer and prevents peeling of said subsequent tungsten layer.

7. The method of claim 1 wherein said amorphous silicon is deposited using dichlorosilane gas.

8. The method of forming tungsten plug metallization without peeling of the tungsten or the glue layer in the fabrication of integrated circuits comprising:

providing semiconductor device structures in and on a semiconductor substrate;

providing an insulating layer covering said semiconductor device structures wherein a contact hole has been opened through said insulating layer to said semiconductor substrate;

depositing a layer of titanium conformally over the surface of said insulating layer and within said contact opening;

depositing a layer of titanium nitride over said titanium layer;

annealing said titanium nitride layer in a nitrogen ambient at a temperature of between about 400° to 480° C. wherein nitrogen atoms from said nitrogen ambient fill the grain boundaries of said titanium nitride layer preventing penetration of said titanium nitride layer by subsequent metallization and wherein said preventing penetration prevents peeling of said titanium nitride layer;

depositing a layer of amorphous silicon to a thickness of between about 50 to 100 Angstroms overlying said titanium nitride layer to prevent peeling of said titanium nitride layer and to prevent peeling of said tungsten to be deposited subsequently; and forming a tungsten plug within said contact opening in the fabrication of said integrated circuit.

9. The method of claim 8 wherein said titanium layer has a thickness of between about 200 to 600 Angstroms.

10. The method of claim 8 wherein said titanium nitride layer is deposited to a thickness of between about 600 to 2000 Angstroms.

11. The method of claim 8 wherein said titanium nitride layer is annealed in a furnace for between about 10 to 20 minutes.

12. The method of claim 11 wherein said annealing of said glue layer and said amorphous silicon layer deposition are performed within the same furnace without breaking vacuum between said annealing and said deposition.

13. The method of claim 8 wherein said amorphous silicon layer is deposited at a temperature of between about 450° to 480° C. at a pressure of less than about 0.2 Torr and wherein said amorphous silicon layer will prevent penetration of said underlying titanium nitride layer by subsequent metallization and wherein said preventing penetration prevents said peeling of said titanium nitride layer and prevents peeling of said subsequent tungsten layer.

14. The method of forming tungsten plug metallization without peeling of the tungsten or the glue layer in the fabrication of integrated circuits comprising:

providing semiconductor device structures in and on a semiconductor substrate;

providing an insulating layer covering said semiconductor device structures wherein a contact hole has been opened through said insulating layer to said semiconductor substrate;

depositing a glue layer conformally over the surface of said insulating layer and within said contact opening;

annealing said glue layer in a nitrogen ambient at a temperature of between about 580° to 650° C. wherein nitrogen atoms from said nitrogen ambient fill the grain boundaries of said glue layer preventing penetration of said glue layer by subsequent metallization and wherein said preventing penetration prevents peeling of said glue layer;

depositing a layer of amorphous silicon overlying said glue layer wherein said amorphous silicon layer will prevent penetration of said underlying glue layer by subsequent metallization and wherein said preventing penetration prevents said peeling of said glue layer and prevents peeling of said tungsten to be deposited subsequently; and forming a tungsten plug within said contact opening in the fabrication of said integrated circuit.

15. The method of claim 14 wherein said glue layer is composed of a first layer of titanium having a thickness of between about 200 to 600 Angstroms and a second layer of titanium nitride having a thickness of between about 600 to 2000 Angstroms.

16. The method of claim 14 wherein said glue layer is annealed in a rapid thermal anneal process for between about 20 to 40 seconds.

17. The method of claim 14 wherein said amorphous silicon layer is deposited at a temperature of between about 450° to 480° C. at a pressure of less than about 0.2 Torr to a thickness of between about 50 to 100 Angstroms.

* * * * *